(12) United States Patent
Kamm

(10) Patent No.: US 7,073,969 B2
(45) Date of Patent: Jul. 11, 2006

(54) METHOD FOR FABRICATING A PHOTOMASK FOR AN INTEGRATED CIRCUIT AND CORRESPONDING PHOTOMASK

(75) Inventor: Frank-Michael Kamm, Dresden (DE)

(73) Assignee: Infineon Technologies, AG, Munich (DE)

( * ) Notice: Subject to any disclaimer, the term of this patent is extended or adjusted under 35 U.S.C. 154(b) by 89 days.

(21) Appl. No.: 10/736,775

(22) Filed: Dec. 17, 2003

(65) Prior Publication Data
US 2004/0198047 A1 Oct. 7, 2004

(30) Foreign Application Priority Data
Dec. 18, 2002 (DE) ................ 102 59 331

(51) Int. Cl.
*G01F 9/00* (2006.01)
(52) U.S. Cl. ......................................... 403/5
(58) Field of Classification Search ............... 430/5, 430/322–324
See application file for complete search history.

(56) References Cited

U.S. PATENT DOCUMENTS

| 5,052,033 | A | | 9/1991 | Ikeda et al. | |
|---|---|---|---|---|---|
| 5,618,643 | A | * | 4/1997 | Dao et al. | 430/5 |
| 6,607,862 | B1 | * | 8/2003 | Yan et al. | 430/5 |
| 6,919,146 | B1 | * | 7/2005 | Corliss et al. | 430/5 |

OTHER PUBLICATIONS

Hong et al. "Protection of $SrBi_2Ta_2O_9$ ferroelectric capacitors from hydrogen damage by optimized metallization for memory applications" Apply. Physics Letters, vol. 77, No. 1, Jul. 2000, pp. 76-78.

* cited by examiner

*Primary Examiner*—S. Rosasco
(74) *Attorney, Agent, or Firm*—Morrison & Foerster LLP

(57) ABSTRACT

A method for fabricating a photomask for an integrated circuit. The method includes, for example, providing a substrate with at least one trench, providing a prepatterned surface at the bottom of the trench, and providing a multilayer coating over the substrate. As a result, the multilayer coating forms a reflection region on the surface of the substrate outside the trench and a non-reflection region in the trench. The invention additionally provides a corresponding photomask.

8 Claims, 4 Drawing Sheets

METHOD FOR FABRICATING A PHOTOMASK FOR AN INTEGRATED CIRCUIT AND CORRESPONDING PHOTOMASK

CLAIM FOR PRIORITY

This application claims the benefit of priority to German Application No. 102 59 331.0, filed in the German language on Dec. 18, 2002, the contents of which are hereby incorporated by reference.

TECHNICAL FIELD OF THE INVENTION

The present invention relates to a method for fabricating a photomask for an integrated circuit and a corresponding photomask.

BACKGROUND OF THE INVENTION

In microlithography for integrated circuits, there is the problem of configuring the imaging of adjacent openings in the photoresist such that the distance between the structures produced becomes minimal. Every reduction of the distance leads to a reduction of the chip area, thereby making it possible to reduce the costs per chip.

To date, use has usually been made of binary masks (BIM) or halftone masks HTPSM with lithographically more favorable properties, mainly for projection exposure into a wafer coated with positive resist.

In the foreseeable future, with shorter wavelengths in the range of 1 to 100 nm, in particular 10–15 nm, EUV reflection masks (EUV=extreme ultraviolet region) will be used more and more frequently.

Such EUV reflection masks are based on the principle of distributed Bragg reflection, according to which EUV light is reflected at periodically recurring interfaces (multilayers) and interferes constructively in the process. On account of the constructive interference of a plurality of multilayers (typically 40 Mo/Si double layers), the reflectivity is increased to more than 70% in the case of non-glancing incidence.

In order to produce a lithographic imaging, it is necessary to eliminate or reduce the reflectivity of the multilayers locally at the locations at which no imaging is intended to be effected.

In a demagnifying optical arrangement, the mask image is projected onto a resist-coated wafer using such an EUV reflection mask.

FIGS. 3a, b show the layout of a known photomask in two successive fabrication stages.

In FIG. 3, reference symbol 1 designates a glass substrate with a low thermal expansion coefficient. This glass substrate 1 is coated with the layers explained in more detail below in order to form the EUV reflection mask.

The layer 5 designates an optional buffer layer e.g. made of silicon, which serves for smoothing possible unevennesses of the substrate surface of the glass substrate 1.

The multilayer coating 10, which serves to reflect the incident light, is then provided on the buffer layer 5. In the example considered, what is involved is an alternate sequence of silicon and molybdenum layers having a thickness of the order of magnitude of 5 to 8 nanometers corresponding to a wavelength used in the range of 10 to 16 nanometers.

A covering layer 15 made of silicon typically having a thickness of 11 nm is deposited above the multilayer coating 10, which covering layer serves as it were as a chemical protection layer.

An upper buffer layer 20, e.g. made of silicon oxide, is then deposited over the covering layer 15, which buffer layer is intended to afford protection of the underlying layers during the patterning of the overlying absorber layer 25 made of chromium. This patterning is effected for example by means of a photolithographic ion etching process and leads to the process state shown in FIG. 3a.

With reference to FIG. 3b, after the patterning of the absorber layer 25 and after repairs that possibly have to be carried out thereon, the upper buffer layer 20 is removed in order to uncover the covering layer 15. As shown in FIG. 2b, for imaging purposes, EUV light is then radiated onto the upper surface of this EUV mask at an angle of typically 50° with respect to the normal to the surface, which light is absorbed (light beam LB) on the non-reflection regions NR covered with chromium, and is reflected by the multilayer coating 10 in the reflection regions R not covered by chromium and interferes constructively in the process (light beam LB').

A series of technical problems result on account of the abovementioned multilayer arrangement of this known EUV reflection mask, in particular the arrangement of the absorber layer 25 as topmost layer above the reflective multilayers.

Thus, during the patterning and possible repair of the absorber layer 25, the underlying multilayers have to be protected by the upper buffer layer 20 since otherwise the periodicity of the interfaces of the multilayer coating 10 might be lost. The distance between the absorber layer 25 and the multilayer coating 10 is increased by the upper buffer layer 20 that is required. This results in the geometrical effects during imaging such as e.g. shading effects and line offset.

Since it is necessary to pattern not only the absorber layer 25 but also the underlying buffer layer 20, an inspection and repair qualification of both layers likewise becomes necessary. Overall, the entire mask system is highly susceptible to defects in the individual layers due to the relatively complicated multilayer construction.

SUMMARY OF THE INVENTION

The present invention provides an improved method for fabricating a photomask for an integrated circuit and a corresponding improved photomask, which enable the possibility of simpler fabrication.

The present invention is based on forming non-reflective regions in trenches which lie in the substrate.

In one embodiment according to the invention, the substrate is prepatterned and subsequently coated with the multilayers. The multilayer growth is locally selectively suppressed or greatly damaged by virtue of the prepatterning. Consequently, the reflectivity is suppressed, or ideally completely suppressed on the prepatterned areas.

Such a prepatterning may be effected, e.g. by greatly increasing the local roughness. No defined interfaces can form on the roughened surface, so that the effect of constructive interference is obviated.

A local increase in the roughness may be effected, e.g. by ion bombardment (in the case of a glass substrate) or by producing a porous surface by means of etching (in the case of a silicon substrate). The topographical separation of the prepatterned and unpatterned areas in the direction perpendicular to the normal to the area ensures a sharp transition between the reflective and non-reflective regions.

A particular advantage of the invention is the omission of the absorber layer and of the upper buffer layer. The upper covering layer is optional, but expedient since it can prevent oxidation of the multilayer coating. Since the multilayer deposition is effected after the patterning, the actual structures may already be subjected to a defect inspection, repair and repair qualification beforehand. Consequently, the multilayers are no longer exposed to a further process step after the deposition, or only to the deposition of an upper protection layer.

In accordance with one preferred embodiment, a plurality of trenches are provided.

In accordance with a further preferred embodiment, the trench or trenches are provided by means of a photolithographic etching process using a mask, e.g. made of photoresist, and the mask protects the surface of the substrate outside the trench or trenches during the prepatterning of the bottom of the trench and is removed before the deposition of a multilayer coating. This has the advantage of dual use of the mask, that is to say for trench etching and for protection during the prepatterning.

In accordance with a further preferred emboidment, the multilayer coating has an alternate sequence of depositions of silicon and molybdenum layers.

In accordance with a further preferred emboidment, during the prepatterning, a roughened surface of the bottom of the trench is produced by means of an etching process.

In accordance with a further preferred embodiment, during the prepatterning, a roughened surface of the bottom of the trench is produced by means of an irradiation process, preferably an ion beam irradiation process.

In accordance with a further preferred embodiment, after the provision of the multilayer coating, a partly transparent covering layer is deposited over the substrate.

In accordance with a further preferred embodiment, after the provision of the multilayer coating a removal and reprovision of the multilayer coating are carried out.

In accordance with a further preferred embodiment, the substrate is a glass substrate or a silicon substrate. The "low thermal expansion materials" ULE (Corning) and ZERODUR (Schott) are suitable, in particular.

In accordance with a further preferred embodiment, during the prepatterning, in order to provide a roughened surface at the bottom of the trench, a rough layer is deposited in the trench.

In accordance with a further preferred embodiment, the substrate has a lower part made of glass and an upper part made of silicon, and, during the provision of the trench, a residual thickness d of the upper part is left in the trench and, during the prepatterning, a roughened surface of the bottom of the trench is produced by means of an etching process.

BRIEF DESCRIPTION OF THE DRAWINGS

Exemplary embodiments of the invention are illustrated in the drawings and explained in more detail in the description below.

In the figures.

In the figures, identical reference symbols designate identical or functionally identical constituent parts.

DETAILED DESCRIPTION OF THE INVENTION

FIGS. 1a–d show successive fabrication steps for a photomask according to the invention as a first embodiment of the present invention.

Figure 1A:
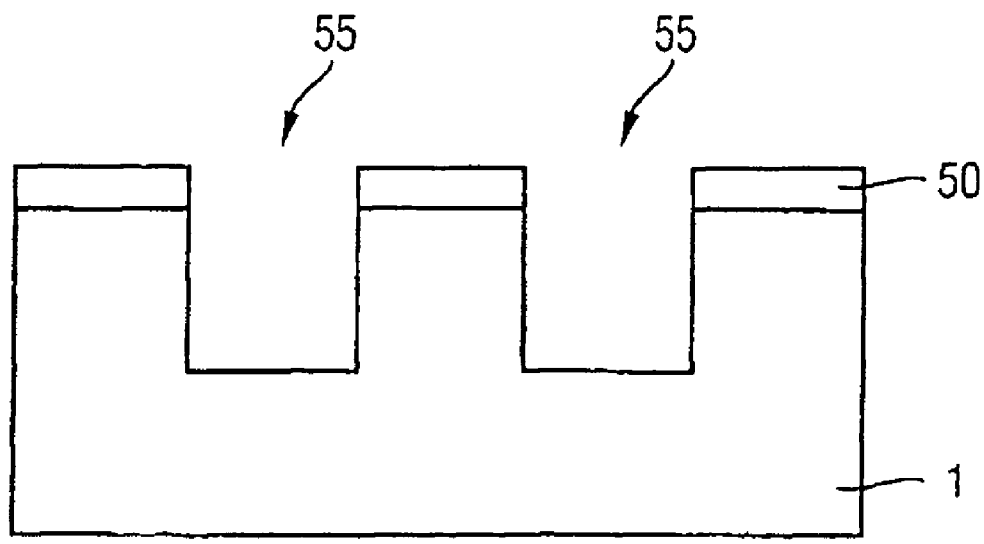
FIGS. 1a–d show successive fabrication steps for a photomask according to the invention as a first embodiment of the present invention.

In accordance with FIG. 1a, a glass substrate 1 is provided, to which a photoresist mask 50 is applied. By means of the photoresist mask 50, trenches 55 are etched into the glass substrate 1, which define the later non-reflective regions.

Figure 1B:
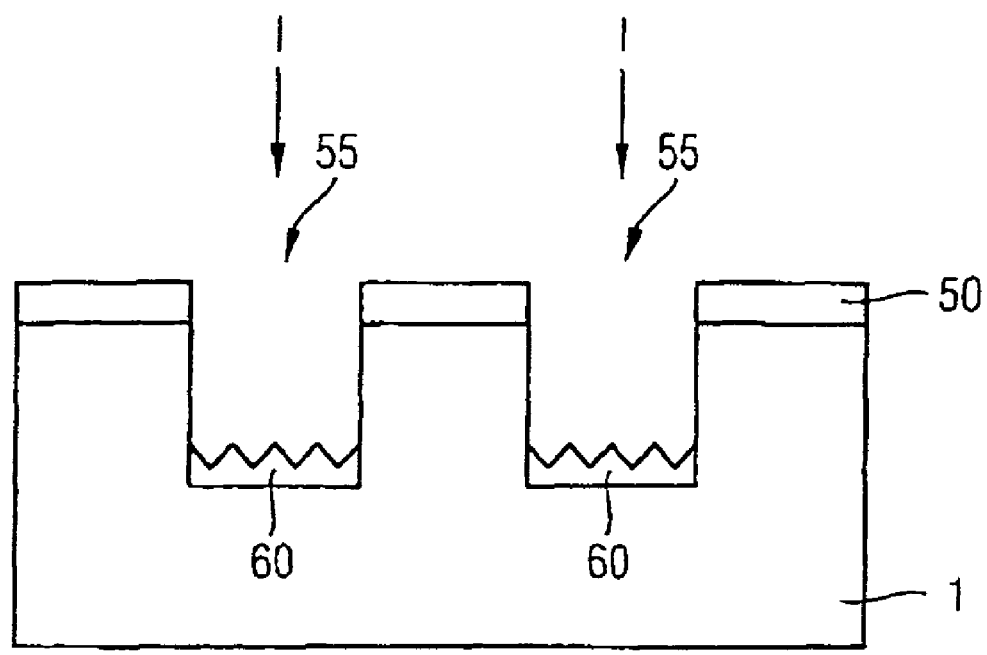

In accordance with FIG. 1b, the glass substrate 1 is then subjected to an ion bombardment I using the photoresist mask 50 in order to form porous regions 60 at the bottoms of the trenches 55.

Figure 1C:
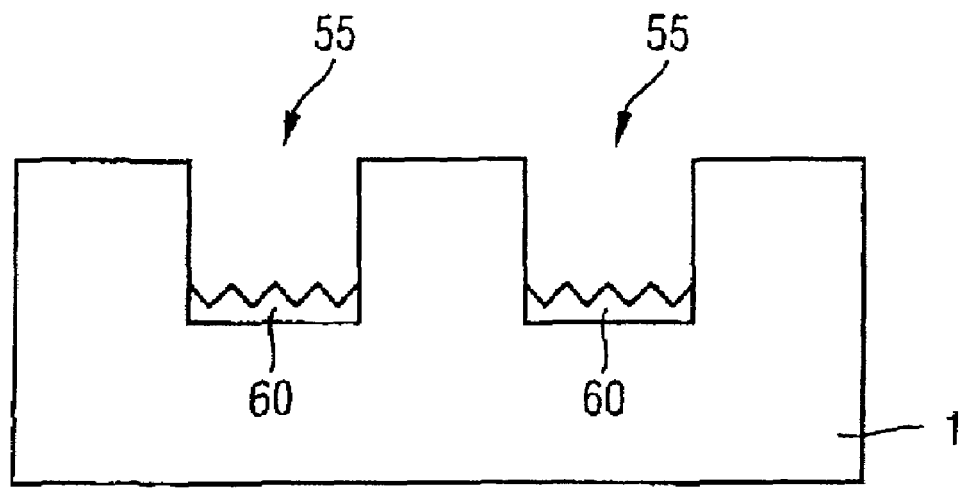

As shown in FIG. 1c, the photoresist mask 55 is subsequently removed.

Figure 1D:
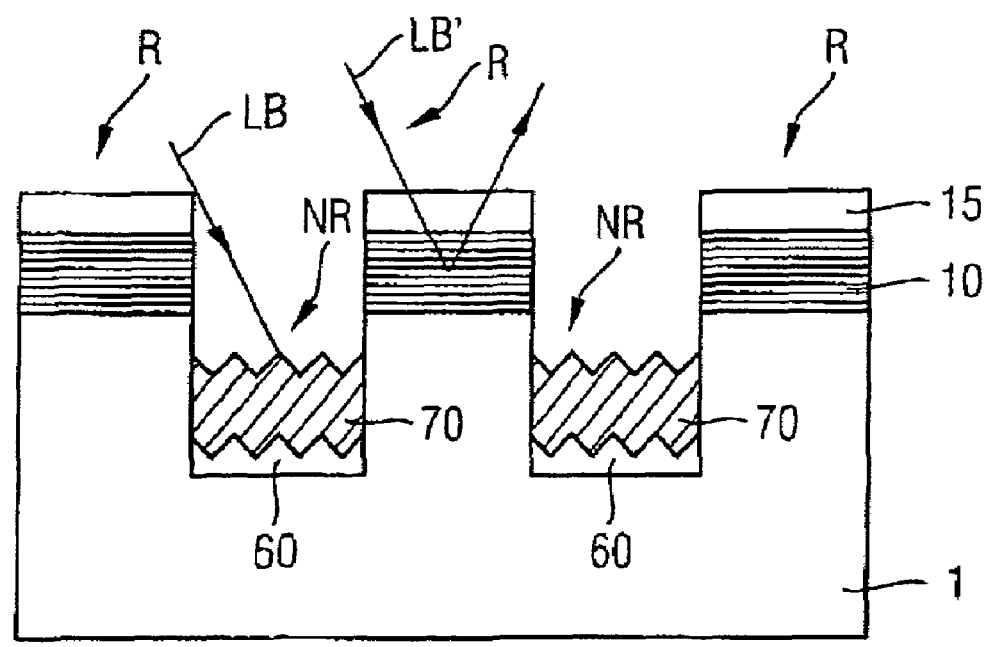

In the subsequent process step illustrated in FIG. 1d, the multilayer coating 10 is then deposited, to be precise in the present example by alternate sputtering of silicon and molybdenum layers having a thickness of 6.9 nm corresponding to a light wavelength of 13.4 nm.

Finally, a covering layer 15 e.g. made of silicon having a thickness of 11 nm is optionally deposited as well.

As a result of this procedure, reflective regions R (light beam LB') form on the uncovered surfaces of the glass substrate 1 since the multilayer coating can be carried out in a desired manner there, i.e. the layers can be produced in plane-parallel and separate fashion. By contrast, no defined interfaces can form in the trenches 55 with the porous trench bottoms, so that the effect of constructive interference cannot occur there and absorbent regions 70 (light beam LB) of the multilayer coating are present.

Although the local prepatterning of the substrate was performed by means of an ion bombardment in the previous embodiments, this is not restricted thereto. Thus, by way of example, depending on the type of substrate, etching processes or deposition processes may be employed in order to carry out such a prepatterning.

Figure 2A:
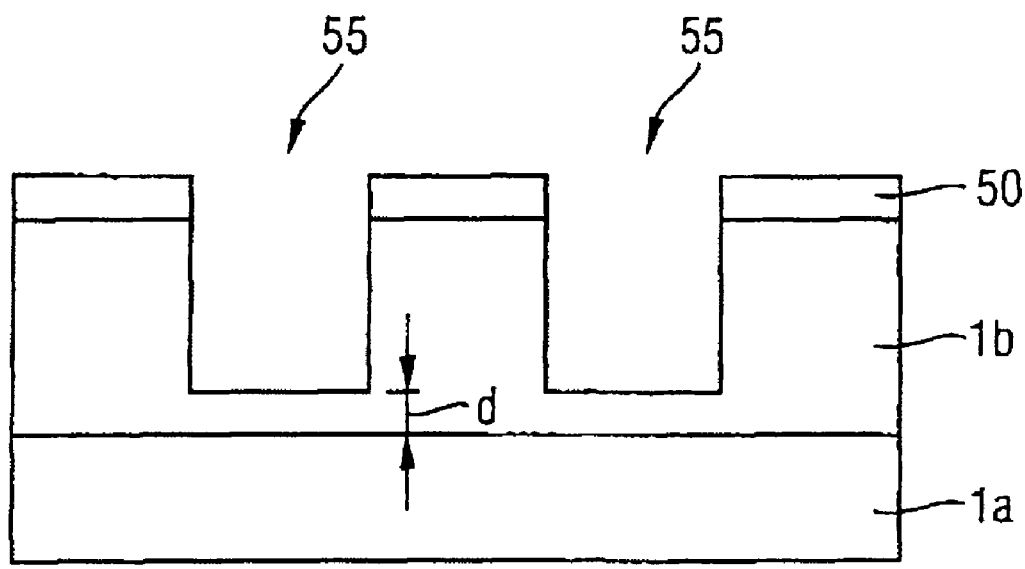
FIGS. 2a,b show successive fabrication steps for a photomask according to the invention as a second embodiment of the present invention.
Figure 2B:
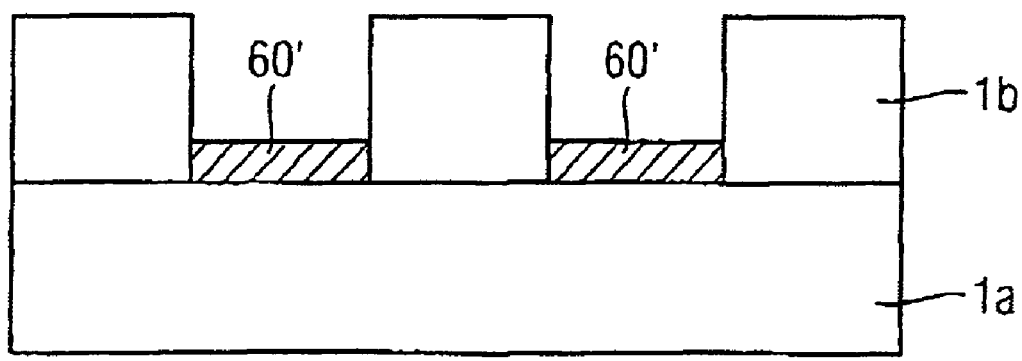
Figure 3A:
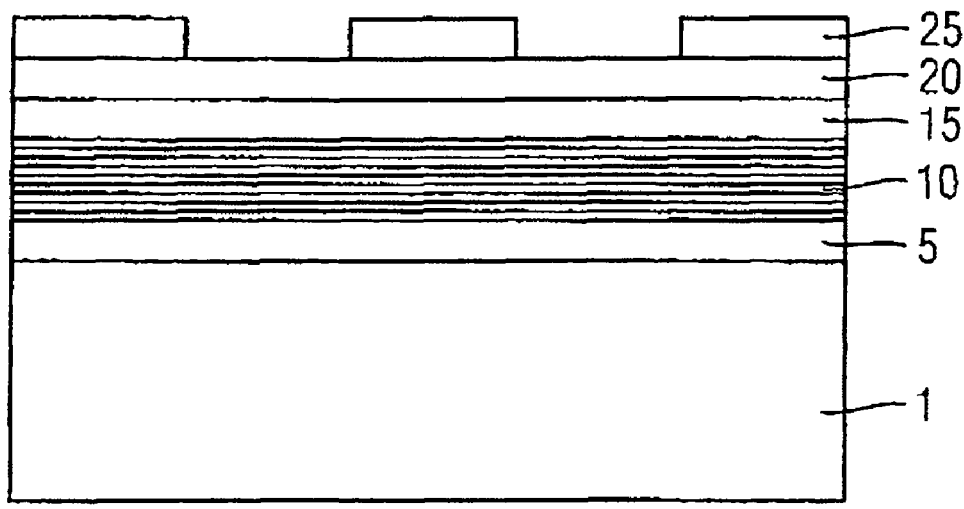
FIGS. 3a,b show the layout of a known photomask.
Figure 3B:
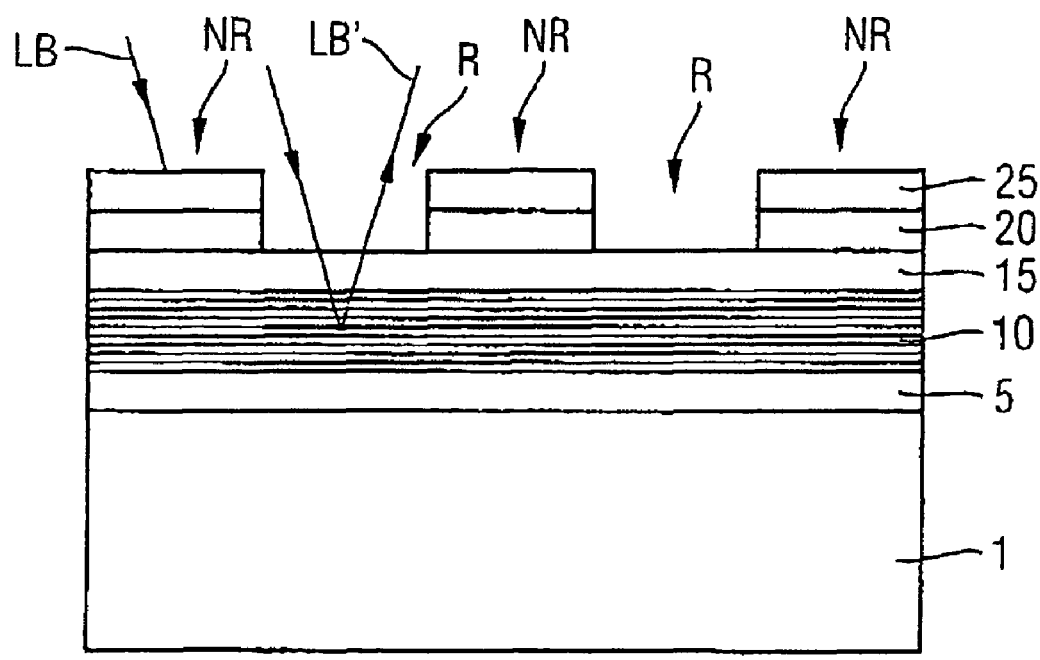

FIGS. 2a,b show successive fabrication steps for a photomask according to the invention as a second embodiment of the present invention.

In the second embodiment, use is made of a double substrate 1a, 1b the lower part 1a of which comprises glass and the upper part 1b of which comprises silicon.

During the trench etching, the upper part 1b made of silicon is not etched through completely, rather a residual thickness d is left in the trenches 55.

This residual thickness region from the upper part 1b made of silicon is then made porous in an anodic etching process and thus becomes the prepatterned surface region 60' on which the later multilayer growth is disturbed. A sidewall passivation layer may be deposited beforehand, if appropriate.

The remaining process steps then proceed in the manner described in the case of the first embodiment above.

Although the present invention has been described above on the basis of preferred exemplary embodiments, it is not restricted thereto, but rather can be modified in diverse ways.

In particular, the materials mentioned are only by way of example and not restrictive.

What is claimed is:

1. A method for fabricating a photomask for an integrated circuit, comprising:

providing a substrate with at least one trench;

selectively prepatterning the surface at the bottom of the trench by an etching process such that the surface becomes roughened; and carrying out a multilayer coating over the substrate, the prepatterning, and the multilayer coating forming a reflection region on the surface of the substrate outside the trench and a non-reflection region in the trench.

2. The method according to claim 1, wherein the multilayer coating has an alternate sequence of depositions of silicon and molybdenum layers.

3. The method according to claim 1, wherein, after the provision of the multilayer coating, a partly transparent covering layer is deposited over the substrate.

4. The method according to claim 1, wherein, after the provision of the multilayer coating a removal and reprovision of the multilayer coating are carried out.

5. The method according to claim 1, wherein the substrate is a glass substrate made of at least one of ULE (Corning) or ZERODUR (Schott), having a low expansion coefficient, or a silicon substrate.

6. The method according to claim 1, wherein the substrate has a lower part made of glass and an upper part made of silicon, and, during the provision of the trench, a residual thickness d of the upper part is left in the trench and, during the prepatterning, a roughened surface of the bottom of the trench is produced by means of an etching process.

7. A method for fabricating a photomask for an integrated circuit, comprising:

providing a substrate having at least one trench;

selectively prepatterning the surface at the bottom of the trench by an irradiation process such that the surface becomes roughened; and carrying out a multilayer coating over the substrate, the prepatterning and the multilayer coating forming a reflection region on the surface of the substrate outside the trench and a non-reflection region in the trench.

8. A method for fabricating a photomask for an integrated circuit, comprising:

providing a substrate having at least one trench;

selectively prepatterning the surface at the bottom of the trench by depositing a rough layer on the surface; and carrying out a multilayer coating over the substrate, the prepatterning and the multilayer coating forming a reflection region on the surface of the substrate outside the trench and a non-reflection region in the trench.

* * * * *